(12) United States Patent
Buch et al.

(10) Patent No.: US 11,656,937 B2
(45) Date of Patent: May 23, 2023

(54) TECHNIQUES FOR ERROR DETECTION AND CORRECTION IN A MEMORY SYSTEM

(71) Applicant: Micron Technology, Inc., Boise, ID (US)

(72) Inventors: Steffen Buch, Munich (DE); Aaron P. Boehm, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/396,522

(22) Filed: Aug. 6, 2021

(65) Prior Publication Data

US 2022/0066873 A1 Mar. 3, 2022

Related U.S. Application Data

(60) Provisional application No. 63/070,139, filed on Aug. 25, 2020.

(51) Int. Cl.
*H03M 13/00* (2006.01)
*G06F 11/10* (2006.01)
(Continued)

(52) U.S. Cl.
CPC ........ *G06F 11/1068* (2013.01); *G06F 11/076* (2013.01); *G06F 11/0772* (2013.01); *H03M 13/1575* (2013.01)

(58) Field of Classification Search
CPC ............. G06F 11/1068; G06F 11/1044; G06F 11/076; G06F 11/0751; G06F 11/1072; G06F 11/00; G06F 11/108; H03M 13/1575; H03M 13/19; H03M 13/095; H03M 13/03
See application file for complete search history.

(56) References Cited

U.S. PATENT DOCUMENTS 8,086,933 B2 * 12/2011 Yamaga .............. G06F 11/1072
714/755
8,539,312 B2 9/2013 Hargan
(Continued)

OTHER PUBLICATIONS

ISA/KR, International Search Report and Written Opinion of the International Searching Authority, Int'l Appl. No. PCT/US2021/045997, dated Dec. 1, 2021, Korean Intellectual Property Office, Seo-gu, Daejeon, Republic of Korea, 9pgs.

*Primary Examiner* — Esaw T Abraham
(74) *Attorney, Agent, or Firm* — Holland & Hart LLP (57) ABSTRACT

Methods, systems, and devices for techniques for error detection and correction in a memory system are described. A host device may perform an error detection procedure on data received from the memory device, in addition to one or more error correction procedures that may be performed by the host device, the memory device, or both to correct transmission- or storage-related errors within the system. The error detection procedure may be configured to detect up to a quantity of errors within the data, where the quantity of errors may be greater than a quantity of errors reliably corrected by the one or more error correction procedures. For example, the error detection procedure may be configured to detect a sufficient quantity of errors so as to protect against possible aliasing errors associated with the one or more error correction procedures.

20 Claims, 5 Drawing Sheets

(51) Int. Cl.
*H03M 13/15* (2006.01)
*G06F 11/07* (2006.01)

(56) References Cited

U.S. PATENT DOCUMENTS

| | | | |
|---|---|---|---|
| 8,984,368 B2* | 3/2015 | Loh | G06F 11/1044 |
| | | | 714/763 |
| 9,203,437 B2* | 12/2015 | Kern | H03M 13/616 |
| 9,268,632 B2* | 2/2016 | Linstadt | G06F 11/1048 |
| 9,471,423 B1* | 10/2016 | Healy | G06F 11/1048 |
| 9,923,580 B2* | 3/2018 | Lee | H03M 13/3715 |
| 10,056,921 B2* | 8/2018 | Lu | H03M 13/6508 |
| 10,090,858 B2* | 10/2018 | Cho | G06F 11/1044 |
| 10,108,512 B2* | 10/2018 | Halbert | G06F 11/008 |
| 10,725,841 B1* | 7/2020 | Rahul | H03M 13/618 |
| 10,884,940 B2* | 1/2021 | Kalamatianos | G06F 12/0886 |
| 11,231,990 B2* | 1/2022 | Otterstedt | G06F 11/076 |
| 2010/0042908 A1 | 2/2010 | Radke | |
| 2014/0047301 A1* | 2/2014 | Kurata | G06F 1/3275 |
| | | | 714/773 |
| 2016/0070508 A1 | 3/2016 | Ghodsi | |
| 2020/0133835 A1 | 4/2020 | Yeh | |
| 2020/0233741 A1 | 7/2020 | Brox et al. | |

\* cited by examiner

TECHNIQUES FOR ERROR DETECTION AND CORRECTION IN A MEMORY SYSTEM

CROSS REFERENCE

The present Application for Patent claims the benefit of U.S. Provisional Patent Application No. 63/070,139 by BUCH et al., entitled "TECHNIQUES FOR ERROR DETECTION AND CORRECTION IN A MEMORY SYSTEM," filed Aug. 25, 2020, assigned to the assignee hereof, and expressly incorporated by reference herein.

BACKGROUND

The following relates generally to one or more systems for memory and more specifically to techniques for error detection and correction in a memory system.

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

In a system that includes a memory device and a host device, errors may be introduced into data for a variety of reasons. For example, transmission errors may occur when communicating data between the host device and the memory device. As another example, storage errors may occur while data is stored at the memory device. Accordingly, either or both of a memory device and a host device may employ one or more techniques for detecting or correcting errors, such as errors potentially introduced when communicating or storing data. For example, the memory device, the host device, or both, may perform respective error detection or correction procedures when data is communicated from the host device to the memory device, when data is retrieved from a memory array at the memory device, when data is communicated from the memory device to the host device, or any combination thereof.

An error detection or correction procedure may be based on generating and checking parity information for data using a code, which may be referred to as an error detecting code (EDC) or error correcting code (ECC). Thus, an error detection procedure may in some case be referred to as an EDC procedure, and an error correction procedure may in some case be referred to as an ECC procedure. In some cases, depending how it is utilized by a system, the same code may be able to be used as either an EDC code or an ECC code, or both. A given error detection or correction procedure may be able to reliably (e.g., with one hundred percent reliability) detect or correct up to a certain quantity of errors (e.g., quantity of erroneous bits) in a set of data but unable to detect when a set of data includes a greater quantity of errors, either entirely or at least not with one hundred percent reliability. For example, a single-error-correction (SEC) procedure may be able to detect and correct a single error in a set of data, and a SEC-double-error-detection (SECDED) scheme may be able to detect up to two errors and correct one error in a set of data, among other examples of error detection and correction procedures.

In some cases, if a set of data includes more errors than an error correction procedure is capable of reliability detecting or correcting, the error correction procedure may itself increase the quantity of errors included in the data. For example, if device performs an SEC procedure on a set of data that includes a double-bit error, the double-bit error may go undetected, and in attempting to correct a perceived single-bit error, the device may alter the value of a different bit. This may introduce a third erroneous bit into the set of data and convert the double-bit error into a triple-bit error. The introduction of an additional erroneous bit when attempting to correct one or more bit errors may be referred to as aliasing or bit aliasing.

Bit aliasing may, in some cases, result in errors going undetected or uncorrected when the original (pre-aliasing) errors would have been detected by another error detection or correction procedure subsequently performed within a system. For example, if a memory device aliases a double-bit error into a triple-bit error, and the host device then performs a SECDED procedure upon receiving the data, the SECDED procedure at the host device may fail to detect or correct the triple-bit error, when—but for the aliasing at the memory device—the SECDED procedure at the host device would have been able to detect the original double-bit error. Generally, bit aliasing may occur as a result of any error correction procedure within a system and may result in a set of data including an increased quantity of errors that may be undetectable by any error detection or correcting procedure that is subsequently performed on the set of data.

The present disclosure provides techniques for improving the reliability of a system by implementing error detection at a host device that is capable of detecting up to at least three errors (e.g., up to at least triple-bit errors) in a set of data. For example, a system may implement a corresponding error correction procedure for one or more potential error mechanisms within a system (e.g., when data is communicated between the host device and the memory device, when retrieving data that has been stored at the memory device) and also implement error detection at the host device that is powerful enough (e.g., in terms of quantity of detectable errors) to detect when an error correction procedure introduces an aliasing error (or when a relatively large number of errors is present for any other reason, and which may go undetected or uncorrected by the one or more error correction procedures performed within the system).

Features of the disclosure are initially described in the context of systems and dies as described with reference to FIGS. 1 and 2. Features of the disclosure are described in the context of a system as described with reference to FIG. 3. These and other features of the disclosure are further illustrated by and described with reference to an apparatus diagram and flowcharts that relate to techniques for error detection and correction in a memory system as described with reference to FIGS. 4 and 5.

Figure 1:
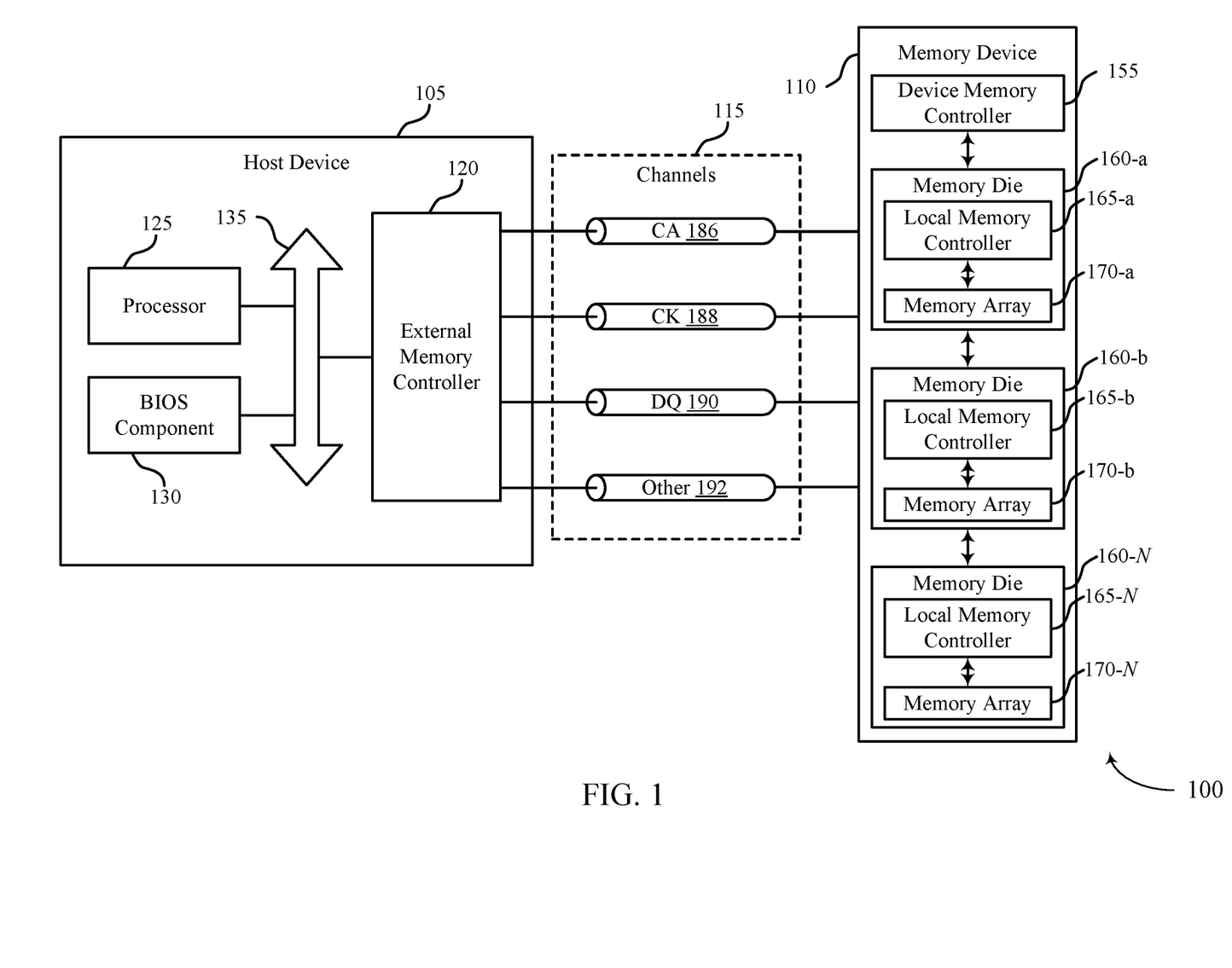
FIG. 1 illustrates an example of a system that supports techniques for error detection and correction in a memory system in accordance with examples as disclosed herein.

FIG. 1 illustrates an example of a system 100 that supports techniques for error detection and correction in a memory system in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110). The system 100 may be referred to as a memory device or memory devices.

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external controller 120. In some examples, the external controller 120 may be referred to as a host or a host device 105.

A memory device 110 may be an independent device or a component that is operable to provide physical addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external controller 120). Such commands may include one or more of a write command for a write operation, a read command for a read operation, a refresh command for a refresh operation, or other commands. The host device 105 and the memory device 110 may (e.g., together or separately) perform one or more error detection procedures and/or error correction procedures to detect or correct errors in bits of data stored at the memory device 110 and accessed by the host device 105.

The host device 105 may include one or more of an external controller 120, a processor 125, a basic input/output system (BIOS) component 130, or other components such as one or more peripheral components or one or more input/output controllers. The components of host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

In some examples, the system 100 or the host device 105 may include various peripheral components. The peripheral components may be any input device or output device, or an interface for such devices, that may be integrated into or with the system 100 or the host device 105. Examples may include one or more of: a disk controller, a sound controller, a graphics controller, an Ethernet controller, a modem, a universal serial bus (USB) controller, a serial or parallel port, or a peripheral card slot such as peripheral component interconnect (PCI) or specialized graphics ports. The peripheral component(s) may be other components understood by a person having ordinary skill in the art as a peripheral.

In some examples, the system 100 or the host device 105 may include an I/O controller. An I/O controller may manage data communication between the processor 125 and the peripheral component(s), input devices, or output devices. The I/O controller may manage peripherals that are not integrated into or with the system 100 or the host device 105.

In some examples, the I/O controller may represent a physical connection or port to external peripheral components.

In some examples, the system 100 or the host device 105 may include an input component, an output component, or both. An input component may represent a device or signal external to the system 100 that provides information, signals, or data to the system 100 or its components. In some examples, and input component may include a user interface or interface with or between other devices. In some examples, an input component may be a peripheral that interfaces with system 100 via one or more peripheral components or may be managed by an I/O controller. An output component may represent a device or signal external to the system 100 operable to receive an output from the system 100 or any of its components. Examples of an output component may include a display, audio speakers, a printing device, another processor on a printed circuit board, and others. In some examples, an output may be a peripheral that interfaces with the system 100 via one or more peripheral components or may be managed by an I/O controller.

The memory device 110 may include a device controller 155 and one or more memory dies 160 (e.g., memory chips) to support a desired capacity or a specified capacity for data storage. Each memory die 160 may include a local controller 165 (e.g., local controller 165-a, local controller 165-b, local controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. In some cases, one or more bit errors (e.g., storage errors) may be introduced when storing data within a memory array 170, which may be detected or corrected as described herein. A memory device 110 including two or more memory dies may be referred to as a multi-die memory or a multi-die package or a multi-chip memory or a multi-chip package.

The device controller 155 may include circuits, logic, or components operable to control operation of the memory device 110. The device controller 155 may include the hardware, the firmware, or the instructions that enable the memory device 110 to perform various operations and may be operable to receive, transmit, or execute commands, data, or control information related to the components of the memory device 110. The device controller 155 may be operable to communicate with one or more of the external controller 120, the one or more memory dies 160, or the processor 125. In some examples, the device controller 155 may control operation of the memory device 110 described herein in conjunction with the local controller 165 of the memory die 160. In some cases, the device controller 155 (e.g., or a portion thereof) may perform one or more aspects of an error correction procedure as described herein.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local controller 165 (e.g., local to a memory die 160) may include circuits, logic, or components operable to control operation of the memory die 160. In some examples, a local controller 165 may be operable to communicate (e.g., receive or transmit data or commands or both) with the device controller 155. In some examples, a memory device 110 may not include a device controller 155, and a local controller 165, or the external controller 120 may perform various functions described herein. As such, a local controller 165 may be operable to communicate with the device controller 155, with other local controllers 165, or directly with the external controller 120, or the processor 125, or a combination thereof. Examples of components that may be included in the device controller 155 or the local controllers 165 or both may include receivers for receiving signals (e.g., from the external controller 120), transmitters for transmitting signals (e.g., to the external controller 120), decoders for decoding or demodulating received signals, encoders for encoding or modulating signals to be transmitted, or various other circuits or controllers operable for supporting described operations of the device controller 155 or local controller 165 or both.

The external controller 120 may be operable to enable communication of one or more of information, data, or commands between components of the system 100 or the host device 105 (e.g., the processor 125) and the memory device 110. The external controller 120 may convert or translate communications exchanged between the components of the host device 105 and the memory device 110. In some examples, the external controller 120 or other component of the system 100 or the host device 105, or its functions described herein, may be implemented by the processor 125. For example, the external controller 120 may be hardware, firmware, or software, or some combination thereof implemented by the processor 125 or other component of the system 100 or the host device 105. Although the external controller 120 is depicted as being external to the memory device 110, in some examples, the external controller 120, or its functions described herein, may be implemented by one or more components of a memory device 110 (e.g., a device controller 155, a local controller 165) or vice versa.

The components of the host device 105 may exchange information with the memory device 110 using one or more channels 115. The channels 115 may be operable to support communications between the external controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, CA channels 186 may be operable to communicate commands between the host device 105 and the memory device 110 including control information associated with the commands (e.g., address information). For example, commands carried by the CA channel 186 may include a read command with an address of the desired data. In some examples, a CA channel 186 may include any quantity of signal paths to decode one or more of address or command data (e.g., eight or nine signal paths).

In some examples, data channels 190 may be operable to communicate one or more of data or control information between the host device 105 and the memory device 110. For example, the data channels 190 may communicate information (e.g., bi-directional) to be written to the memory device 110 or information read from the memory device 110. In some cases, one or more bit errors (e.g., transmission errors) may be introduced when communicating data via data channels 190, which may be detected or corrected as described herein.

In some examples, the one or more other channels 192 may include one or more error detection code (EDC) channels. The EDC channels may be operable to communicate error detection signals, such as checksums, to improve system reliability. An EDC channel may include any quantity of signal paths.

As described herein, the memory device 110, the host device 105, or both may employ one or more techniques for detecting or correcting errors that may be introduced within the system 100, such as when communicating data via channels 115 or storing data within a memory array 170. For example, the memory device 110 and the host device 105 may perform respective error correction procedures when data is received via the channels 115, which may be referred to as link ECC procedures and may be configured to correct one or more transmission errors associated with the data being communicated via the channels 115. As another example, the memory device 110 may be configured to perform an error correction procedure when data is read from a memory array 170, which may be referred to as an on-die ECC procured and may be configured to correct one or more storage errors associated with the data having been stored within the memory array 170. The error correction procedures may each be able to detect up to at least one error in given set of data (e.g., may each be SEC or stronger, such as SECDED).

To avoid aliasing-related or other higher-order errors (e.g., triple-bit errors) going undetected, the host device 105 may perform an error detection procedure on data received from the memory device 110 (e.g., in response to a read command). For example, the host device 105 may be configured to perform a triple-error-detection (TED) procedure on the set of data after receiving the set of data, where the TED procedure may be configured to reliably detect up to three bit errors within a set of data. In some cases, generally, at each communications interface via which data is exchanged and when data is retrieved from a memory array 170, a corresponding error correction procedure may be performed to correct up to at least one bit error in a set of data may be performed (e.g., SEC or stronger), and a higher-order error detection procedure may be performed at the host device 105 (e.g., TED or stronger).

Figure 2:
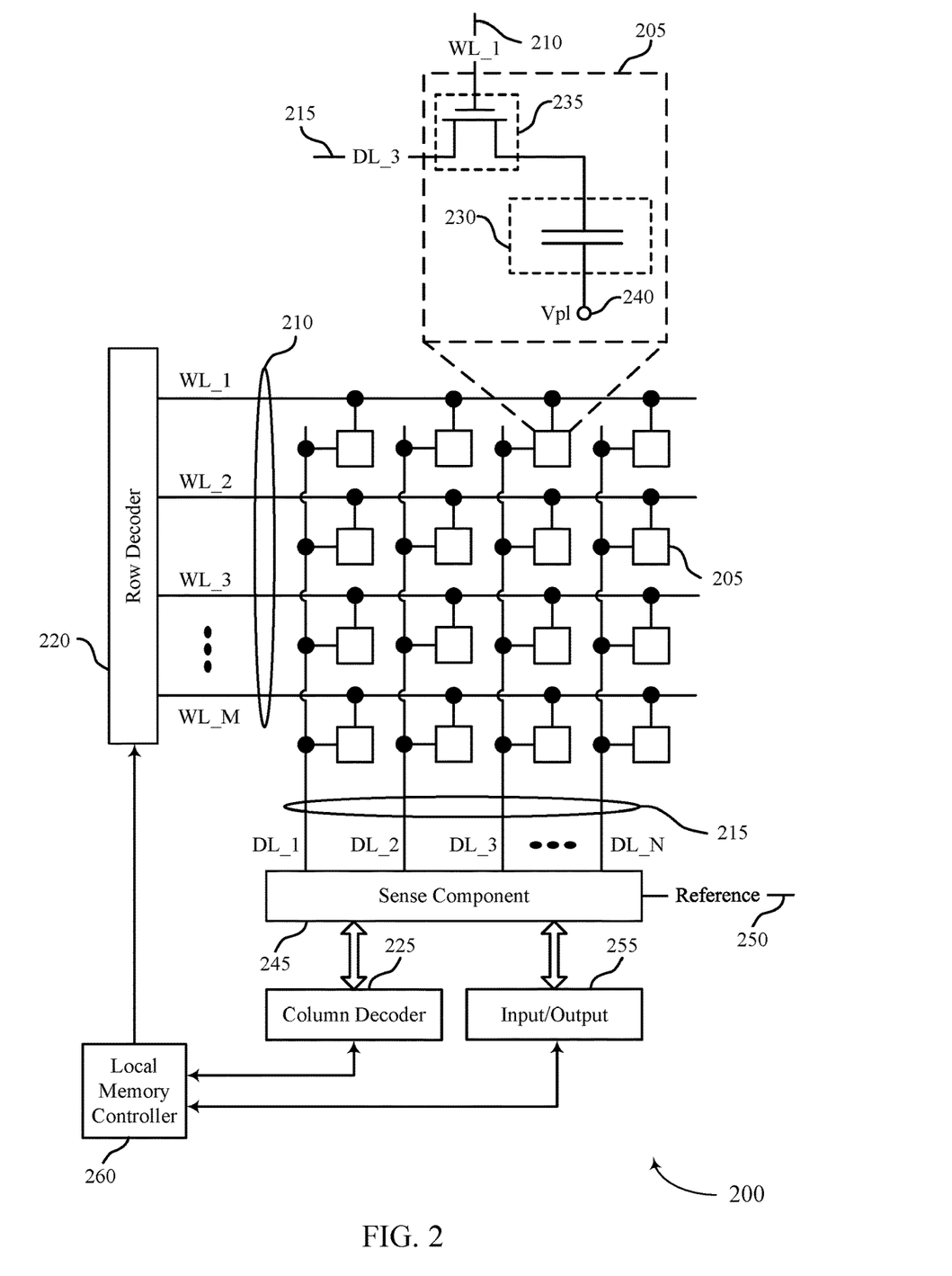
FIG. 2 illustrates an example of a memory die that supports techniques for error detection and correction in a memory system in accordance with examples as disclosed herein.

FIG. 2 illustrates an example of a memory die 200 that supports techniques for error detection and correction in a memory system in accordance with examples as disclosed herein. The memory die 200 may be an example of the memory dies 160 described with reference to FIG. 1. In some examples, the memory die 200 may be referred to as a memory chip, a memory device, or an electronic apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a charge representative of the programmable states in a capacitor. DRAM architectures may include a capacitor that includes a dielectric material to store a charge representative of the programmable state. In other architectures, other storage devices and components are possible. For example, nonlinear dielectric materials may be employed. The memory cell 205 may include a logic storage component, such as capacitor 230, and a switching component 235. The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss.

The memory die 200 may include one or more access lines (e.g., one or more word lines 210 and one or more digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding or operation. Memory cells 205 may be positioned at intersections of the word lines 210 and the digit lines 215.

Operations such as reading and writing may be performed on the memory cells 205 by activating or selecting access lines such as one or more of a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in either a two-dimensional or three-dimensional configuration may be referred to as an address of a memory cell 205.

Accessing the memory cells 205 may be controlled through a row decoder 220 or a column decoder 225. For example, a row decoder 220 may receive a row address from the local controller 260 and activate a word line 210 based on the received row address. A column decoder 225 may receive a column address from the local controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device that includes the memory die 200.

The local controller 260 may control the accessing of memory cells 205 through the various components (e.g., row decoder 220, column decoder 225, sense component 245). The local controller 260 may be an example of the local controller 165 described with reference to FIG. 1. In some examples, one or more of the row decoder 220, column decoder 225, and sense component 245 may be co-located with the local controller 260. The local controller 260 may be operable to receive one or more of commands or data from one or more different controllers (e.g., an external controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local controller 260 may generate row signals and column address signals to activate the target word line 210 and the target digit line 215. The local controller 260 may also generate and control various voltages or currents used during the operation of the memory die 200. In general, the amplitude, the shape, or the duration of an applied voltage or current discussed herein may be varied and may be different for the various operations discussed in operating the memory die 200. The local controller 260 (e.g., or a portion thereof) may perform one or more error correction procedures as described herein.

The local controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local controller 260 in response to various access commands (e.g., from a host device 105). The local controller 260 may be operable to perform other access operations not listed here or other operations related to the operating of the memory die 200 that are not directly related to accessing the memory cells 205.

The local controller 260 may be operable to perform a write operation (e.g., a programming operation) on one or more memory cells 205 of the memory die 200. During a write operation, memory cells 205 of the memory die 200 may be programmed to store desired logic states. The write operation may include receiving a write command and associated data from a host device, as well as first parity bits for the associated data. The memory device may use the first parity bits as part of a first error correction procedure to check for and potentially correct one or more errors in the received data (e.g., transmission errors associated with communicating the data from the host device to the memory device), and the memory device may store the data using one or more memory cells 205 as described herein (e.g., after performing the first error correction procedure). Receiving parity information and using that parity information to check for one or more transmission errors associated with the data may be an example of a link ECC procedure, and thus the memory device, using parity information received from the host device, may perform a link ECC procedure on data received from the host device.

The memory device may additionally generate and store second parity bits for the data (e.g., after performing the link ECC procedure on the data), which may support the memory device subsequently performing a second error correction procedure on the data to correct any potential storage errors associated with the data. For example, in some cases, a memory cell 205 may be defective (e.g., suffer from an abnormally high level of leakage) or experience a transient condition (e.g., heat or electromagnetic interference), which may result in corruption, degradation, or loss of a logic state stored at the memory cells 205. Thus, a logic value read from the memory cell 205 may in some cases not be the same as the logic value most recently written to the memory cell 205, resulting in a storage error.

During a read operation, the logic states stored in the memory cells 205 to which the data was previously written may be determined (e.g., sensed). To protect against storage errors, the memory device may also read the associated second parity bits from the memory cells 205 to which the second parity bits were previously written. The memory device may use the second parity bits as part of the second error correction procedure to check for and potentially correct one or more errors in the data. Generating and storing parity information for data written to a memory array and later using that parity information to check for one or more storage errors associated with the data may be an example of an on-die ECC procedure, and thus the memory die 200 may perform an on-die ECC procedure on data stored using the memory cells 205.

In connection with a read operation, the memory device may also generate third parity bits for the data (e.g., after performing the on-die ECC procedure on the data), which may support the host device subsequently performing a third error correction procedure on the data (e.g., to correct errors associated with communicating the data to the host device). For example, the memory device may communicate the data and the third parity bits to the host device, and the host device may use the third parity bits to perform a second link ECC procedure to check for one or more transmission errors associated with receiving the data from the memory device.

In some cases, the error correction procedures described herein (e.g., link ECC and on-die ECC procedures) may each be capable of reliably correcting up to at least a first quantity of errors in a set of data (e.g., at least single-bit errors). The host device may additionally perform an error detection procedure on data received from the memory device (e.g., in response to a read command), in addition to any other error correction procedure performed by the host device or the memory device to correct storage or communication errors. The error detection procedure may be configured to reliably detect up to a second quantity of errors within the data (e.g., errors of three or more bits). The error detection procedure, in combination with the one or more error correction procedures, may result in a reduced likelihood of any transmission or storage errors going undetected.

Figure 3:
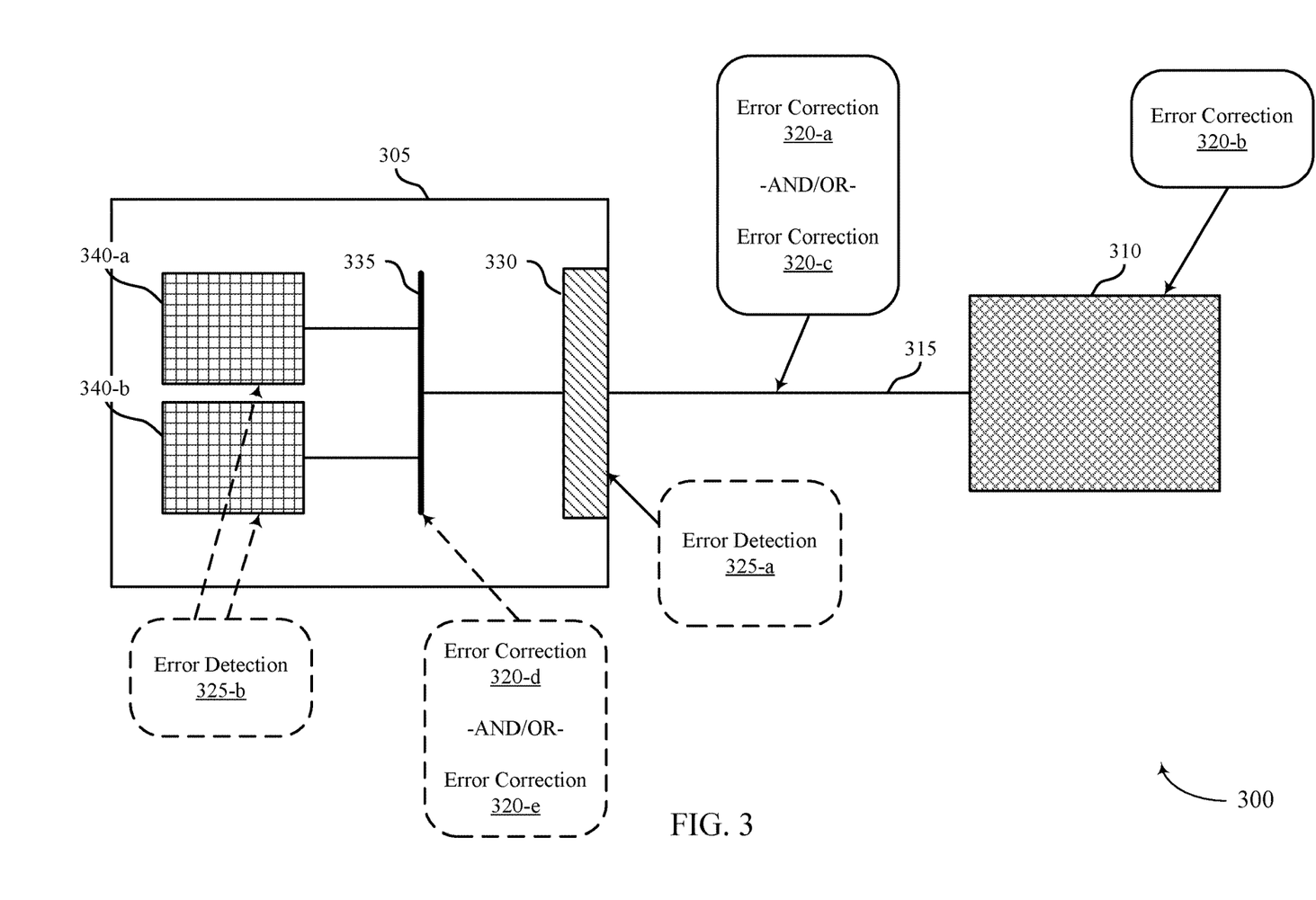
FIG. 3 illustrates an example of a system that supports techniques for error detection and correction in a memory system in accordance with examples as disclosed herein.

FIG. 3 illustrates an example of a system 300 that supports techniques for error detection and correction in a memory system in accordance with examples as disclosed herein. The system 300 may include a host device 305 and a memory device 310, which may be examples of a respective host device and memory device described with reference to FIGS. 1 and 2. The host device 305 and the memory device 310 may be coupled or selectively couplable via an interface 315. The host device 305 may transmit one or more commands to the memory device 310, for example, to write data from the host device 305 to the memory device 310 or to read data from the memory device 310 to the host device 305. The host device 305 and the memory device 310 may exchange data that is written or read via the interface 315, which may include any quantity of data channels 190.

In some cases, errors may be introduced when communicating data from the host device 305 to the memory device 310 via the interface 315, while storing the data at the memory device 310, when verifying data at the memory device 310, or when communicating data from the memory device 310 to the host device 305 via the interface 315. For example, interference or other noise may corrupt or change one or more bits of data when communicating data between the host device 305 and the memory device 310 (e.g., in either direction of communication, via the interface 315). Similarly, data degradation may occur when data is stored at the memory device 310 (e.g., due to environmental or device factors), which also may introduce one or more bit errors into the data.

Accordingly, the memory device 310 and/or the host device 305 may employ one or more techniques for detecting or correcting errors potentially introduced when communicating or storing data. The memory device 310, the host device 305, or both, may perform one or more error correction procedures 320 on data stored at the memory device 310 or communicated via the interface 315.

For example, the host device 305 and the memory device 310 may perform a first error correction procedure 320-a on data communicated via the interface 315 from the host device 305 to the memory device 310, which may be an example of a first link ECC procedure. The first error correction procedure 320-a may include generating, at the host device 305, a first set of parity bits based on data to be communicated to the memory device 310 (e.g., data to be written to the memory device 310). The host device 305 may transmit the data and the first set of parity bits to the memory device 310, for example, via the interface 315 (e.g., and may communicate an associated command to write the data to the memory device 310). As part of the first error correction procedure 320-a, the memory device 310 may use the first parity bits to correct one or more erroneous bits in the data. For example, the memory device 310 may receive the data and the first set of parity bits and may generate (e.g., at a controller or other component of the memory device 310) a second set of parity bits based on the received data. The memory device 310 may compare the first set of parity bits and the second set of parity bits and may correct up to a first quantity of errors based on the comparison (e.g., may correct an error based on one or more bits of the first set not matching one or more bits of the second set).

In some cases, the first quantity of errors correctable by the first error correction procedure 320-a may be one error (e.g., an error in one bit)—that is, the first error correction procedure 320-a may be an SEC procedure (e.g., using a code having a Hamming distance of three). Alternatively, the first quantity of errors correctable by the first error correction procedure 320-a may be more than one error (e.g., an error in multiple bits). And in some cases, the first error correction procedure 320-a may be a SECDED procedure (e.g., using a code having a Hamming distance of four). In general, the first error correction procedure 320-a may be able to able to correct at least one bit error (e.g., may be SEC or stronger, may use a code having a Hamming distance of three or more).

The memory device 310 may perform a second error correction procedure 320-b on data stored at the memory device 310 (e.g., when accessing the data during and after storage and before communicating the data to the host device 305), which may be an example of an on-die ECC procedure. The second error correction procedure 320-b may include generating and storing, at the memory device 310, a first set of parity bits based on data to be stored at the memory device 310 (e.g., data received from the host device 305, such as with a write command, and in some cases after the completion of the first error correction procedure 320-a). The memory device 310 may access the data and the first set of parity bits (e.g., after data storage and in response to a read command for the data) and may generate (e.g., at a controller or other component of the memory device 310) a second set of parity bits based on the accessed data. The memory device 310 may compare the first set of parity bits and the second set of parity bits and may correct up to a second quantity of errors based on the comparison (e.g., may correct an error based on one or more bits of the first set not matching one or more bits of the second set).

In some cases, the second error correction procedure 320-b may be an SEC procedure, or in some cases the second error correction procedure 320-b may be a SECDED procedure, as examples. In general, the second error correction procedure 320-b may be able to able to correct at least one bit error (e.g., may be SEC or stronger, may use a code having a Hamming distance of three or more).

The memory device 310 and the host device 305 may perform a third error correction procedure 320-c on data communicated via the interface 315 from the memory device 310 to the host device 305 (e.g., in response to a command to read the data to the host device 305), which may be an example of a second link ECC procedure. The third error correction procedure 320-c may include generating, at the memory device 310, a first set of parity bits based on data to be communicated to the host device 305 (e.g., data read from the memory device 310). The memory device 310 may transmit the data and the first set of parity bits to the host device 305, for example, via the interface 315. The host device 305 may receive the data and the first set of parity bits and may generate (e.g., at the interface controller 330 or other component of the host device 305) a second set of parity bits based on the received data. The host device 305 may compare the first set of parity bits and the second set of parity bits and may correct up to a third quantity of errors based on the comparison (e.g., may correct an error based on one or more bits of the first set not matching one or more bits of the second set).

In some cases, the third error correction procedure 320-c may be an SEC procedure, or in some cases the third error correction procedure 320-c may be a SECDED procedure, as examples. In general, the third error correction procedure 320-c may be able to able to correct at least one bit error (e.g., may be SEC or stronger, may use a code having a Hamming distance of three or more).

In some cases, one or more of the first error correction procedure 320-a, the second error correction procedure 320-b, or the third error correction procedure 320-c may alias one or more bits, resulting in one or more additional errors in a set of data that is written to the memory device 310, then stored at the memory device 310, then read from the memory device 310. For example, aliasing may occur when performing the first error correction procedure 320-a, the second error correction procedure 320-*b*, or the third error correction procedure 320-*c* (e.g., because such an error procedure may be an SEC procedure). Accordingly, if for example an aliasing error is introduced by the second error correction procedure 320-*b*, the data may include three or more bits of errors after performing the second error correction procedure 320-*b*. Bit aliasing may similarly occur when attempting to correct errors having a larger size than two bits (e.g., three bits or four bits) if a given error correction procedure 320 is configured to detect a bit error having a size smaller than the size of the error.

In the event of aliasing, an error in two bits of data (e.g., or in more bits of data) may be changed to an error in three bits of data (e.g., or more bits of data), instead of correcting the error in the two bits of data. The aliasing may result in a higher amount of errors in the data, which, in some cases, may be undetectable by the error correction procedures 320 subsequently performed by the memory device 310 and/or host device 305. For example, the error correction procedures 320 performed by the memory device 310 and/or host device 305 may be capable of correcting with one-hundred percent reliability single-bit errors but not additional errors in a set of data, and in some cases additionally detecting double-bit errors but not additional errors in a set of data. Of course, independent of aliasing, a quantity of errors that is undetectable by the error correction procedures 320 performed by the memory device 310 and/or host device 305 may exist for any additional or alternative reason as well.

The present disclosure provides techniques for detecting higher-order errors (e.g., bit errors of three or more bits), such as errors introduced into data by communication via an interface (e.g., the interface 315), errors introduced by storage at the memory device 310, or errors (e.g., aliasing errors) introduced by an error correction procedure 320 (e.g., link ECC or on-die ECC procedure). For example, in addition to the error correction procedures 320-*a*, 320-*b*, and 320-*c* performed by the host device 305 and the memory device 310, the host device 305 may perform an error detection procedure 325 on data received from the memory device 310 (e.g., in response to a read command). The error detection procedure 325 may be configured to detect up to a fourth quantity of errors within the data (e.g., errors of three or more bits).

In some cases, the error detection procedure 325 may be performed by an interface controller 330 of the host device 305 (e.g., an error detection procedure 325-*a*). Alternatively, the error detection procedure 325 may be performed by one or more processors 340 or CPUs of the host device 305 (e.g., an error detection procedure 325-*b*). If the error detection procedure 325 (e.g., error detection procedure 325-*b*) is performed by one or more processors 340 or CPUs of the host device 305, one or both of error correction procedures 320-*d* and 320-*e* may be performed to check for and potentially correct errors (e.g., transmission errors) associated with data being communicated via the internal interface 335. For example, the error correction procedure 320-*d* may be configured to correct one or more errors associated with data being transmitted from a processor 340 to the interface controller 330 via the internal interface 335 (e.g., so that the data may be ultimately be written to the memory device 310), and the error correction procedure 320-*e* may be configured to correct one or more errors associated with data being transmitted from the interface controller 330 to a processor 340 via the internal interface 335 (e.g., after the data has been read from the memory device 310). The internal interface 335 may represent a network on a chip (NoC), such as a bus or a path from the interface controller 330 to the one or more processors 340.

The error detection procedure 325 (e.g., error detection procedure 325-*a* or 325-*b*) may include generating, at the host device 305, a first set of parity bits based on data to be communicated to the memory device 310 (e.g., data to be written to the memory device 310). The host device 305 may include the first set of parity bits with the data and may transmit both the data and the first set of parity bits to the memory device 310, for example, via the interface 315 (e.g., with a command to write the data to the memory device 310). In some cases, the first set of parity bits may be transparent to the memory device 310 and the memory device 310 may treat the first set of parity bits as a part of the data (e.g., and may store and access the first set of parity bits along with the data).

The host device 305 may also transmit a read command to the memory device 310, indicating to read the data from the memory device 310 to the host device 305. The host device 305 receive the data (e.g., including the first set of parity bits) and may generate (e.g., at the interface controller 330, a processor 340, or a CPU) a second set of parity bits based on the portion of the received data corresponding to the data based upon which the first set of parity bits was generated (e.g., after performing the third error correction procedure 320-*c*). The host device 305 may compare the first set of parity bits and the second set of parity bits and may detect up to a fourth quantity of errors based on the comparison (e.g., may correct an error based on one or more bits of the first set not matching one or more bits of the second set).

In some cases, the fourth quantity of errors detectable by the error detection procedure 325 may be three errors (e.g., an error in three bits), and thus the error detection procedure 325 may be a TED EDC procedure, and may be based on checking for a non-zero error syndrome in the data (e.g., a not attempting a correction on the data). In some cases, the fourth quantity of errors correctable by the error detection procedure 325 may be more than three errors. In some cases, the EDC code associated with the error detection procedure 325 may have a Hamming distance of four or more, and in some cases may have a same Hamming distance as an ECC code associated with one of the error correction procedures 320 performed within the system 300 (e.g., as the first and third error correction procedures 320-*a* and 320-*c*). For example, in some cases, a TED EDC code associated with the error detection procedure 325 and an ECC code associated with one of the error correction procedures 320 may have a Hamming distance (e.g., four). In some cases, the error detection procedure 325 may even use a same Hamming code as one of the error correction procedures 320 performed within the system 300 (e.g., as the first and third error correction procedures 320-*a* and 320-*c*).

In some cases, the error detection procedure 325 may be a sideband procedure, where parity bits may be communicated via one or more extra lines on a bus or via an extra bus (e.g., a parallel transmission), Alternatively, the error detection procedure 325 may be an inline procedure, where parity bits may be communicated together with the data (e.g., in a same packet on a same bus, such as in a serial transmission).

The error detection procedure 325, in combination with one or more of error correction procedures 320-*a*, 320-*b*, and 320-*c* (e.g., and in some cases, error correction procedures 320-*d* and 320-*e*), may result in a lower likelihood of any error associated with exchanging data between the host device 305 and memory device 310, any error associated with storing data at the memory device 310, or any aliasing error going undetected. Thus, overall reliability of the system 300 may be improved.

For example, each time a set of data is communicated via an interface (e.g., internal interface 335, interface 315) may be an opportunity for one or more errors to be introduced into the data, and the data being stored at the memory device 310 may be another an opportunity for one or more errors to be introduced into the data. Error correction procedures 320 may be configured to detect and correct at least single-bit errors associated with each such error opportunity, which may result in a very low likelihood of the set of data coming to include an undetected double-bit error. And if an undetected double-bit error is introduced, and one of the error correction procedures 320 aliases the double-bit error into a triple-bit error, the error detection procedure 325 may detect the triple-bit error. In some cases, along with being capable of reliably detecting triple-bit errors, the error detection procedure 325 may correct a relatively high percentage (e.g., 99.6 percent) of even higher-order bit errors (e.g., errors of four or more bits) in a set of data.

Thus, system-level interactions between the error correction procedures 320 and the error detection procedure 325 may result in improved overall reliability of the system 300. Such improved reliability may be advantageous in any system, but particularly advantageous for mission-critical or other applications in which high-reliability is particularly desirable. For example, certain implementations (e.g., automotive vehicles, in some cases with autonomous or semi-autonomous driving capabilities) may be subject to increased reliability constraints, and increased reliability using techniques as described herein may be particularly advantageous.

Figure 4:
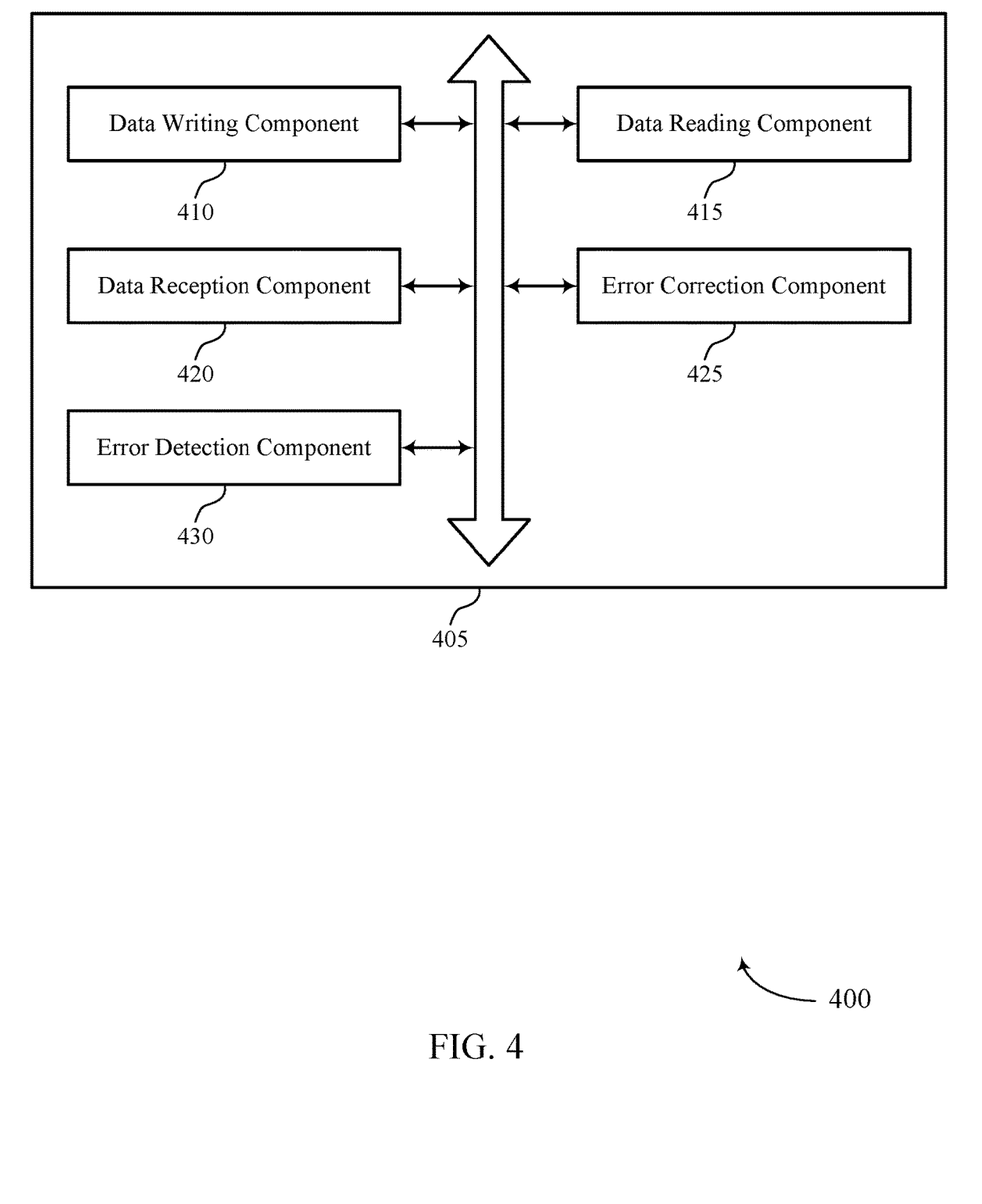
FIG. 4 shows a block diagram of a host device that supports techniques for error detection and correction in a memory system in accordance with examples as disclosed herein.

FIG. 4 shows a block diagram 400 of a host device 405 that supports techniques for error detection and correction in a memory system in accordance with examples as disclosed herein. The host device 405 may be an example of aspects of a host device as described with reference to FIGS. 1-3. The host device 405 may include a data writing component 410, a data reading component 415, a data reception component 420, an error correction component 425, and an error detection component 430. Each of these modules may communicate, directly or indirectly, with one another (e.g., via one or more buses).

The data writing component 410 may write, to a memory device, data from a host device via an interface.

The data reading component 415 may transmit, to the memory device after writing the data, a read command from the host device for the data. The data reception component 420 may receive, at the host device via the interface in response to the read command, the data after a first error correction procedure performed by the memory device on the data, the first error correction procedure to correct up to a first quantity of errors associated with the data being stored at the memory device, the first quantity greater than or equal to one.

The error correction component 425 may perform, at the host device, a second error correction procedure on the data, the second error correction procedure to correct up to a second quantity of errors associated with the data being received via the interface, the second quantity greater than or equal to one.

In some examples, the error correction component 425 may generate, at the host device, first parity bits based on the data written to the memory device. In some examples, the error correction component 425 may transmit the data to the memory device via the interface, where writing the data to the memory device is based on transmitting the data to the memory device via the interface. In some examples, the error correction component 425 may transmit the first parity bits from the host device to the memory device, where the first parity bits are configured to support a third error correction procedure performed by the memory device on the data, the third error correction procedure configured to correct up to a fourth quantity of errors associated with the data being transmitted to the memory device, the fourth quantity greater than or equal to one.

In some examples, the error correction component 425 may receive, from the memory device via the interface, first parity bits based on the data received via the interface. In some examples, the error correction component 425 may generate, at the host device, second parity bits based on the data received via the interface. In some examples, the error correction component 425 may compare, at the host device, the first parity bits and the second parity bits, where performing the second error correction procedure on the data at the host device is based on comparing the first parity bits and the second parity bits.

The error detection component 430 may perform, at the host device after the second error correction procedure, an error detection procedure to detect up to a third quantity of errors in the data, the third quantity greater than or equal to three. In some examples, the error detection component 430 may generate, at the host device, first parity bits based on a portion of the data written to the memory device, where the data written to the memory device includes the portion and the first parity bits. In some examples, the error detection component 430 may generate, at the host device, second parity bits based on a portion of the data received via the interface. In some examples, the error detection component 430 may compare, at the host device, the first parity bits and the second parity bits, where performing the error detection procedure is based on comparing the first parity bits and the second parity bits.

In some cases, the error detection procedure may be configured to detect one or more errors associated with the data being written via the interface, being stored at the memory device, or being received via the interface, or any combination thereof, and the error detection procedure may be configured to detect an aliasing error associated with the error correction procedure, the second error correction procedure, or the third error correction procedure.

In some cases, the error detection procedure may be associated with a first code. In some cases, the second error correction procedure may be associated with a second code that has a same Hamming distance as the first code. In some cases, the first code and the second code may both be a same Hamming code.

Figure 5:
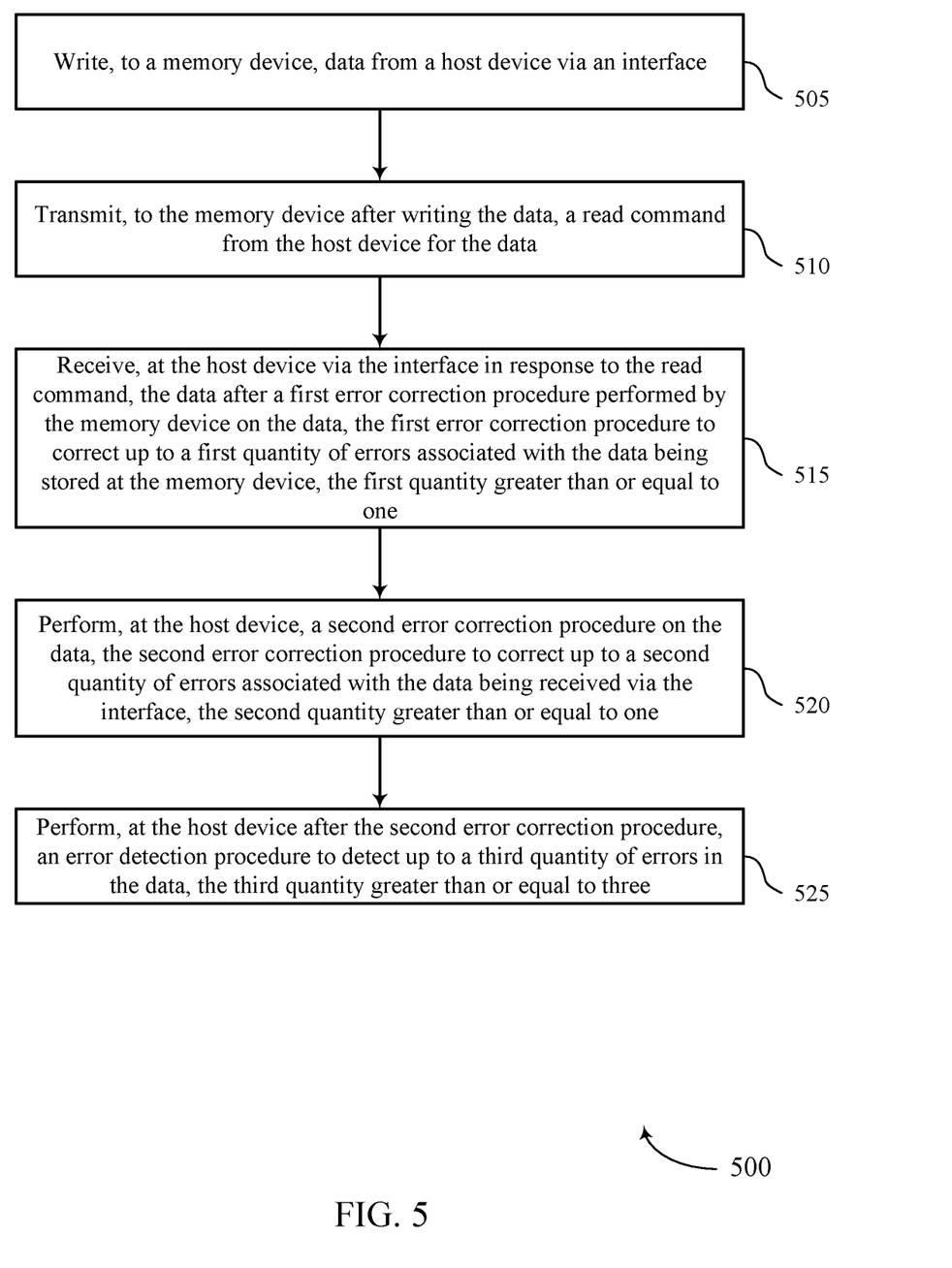
FIG. 5 shows a flowchart illustrating a method or methods that support techniques for error detection and correction in a memory system in accordance with examples as disclosed herein.

FIG. 5 shows a flowchart illustrating a method or methods 500 that supports techniques for error detection and correction in a memory system in accordance with examples as disclosed herein. The operations of method 500 may be implemented by a host device or its components as described herein. For example, the operations of method 500 may be performed by a host device as described with reference to FIG. 4. In some examples, a host device may execute a set of instructions to control the functional elements of the host device to perform the described functions. Additionally or alternatively, a host device may perform aspects of the described functions using special-purpose hardware.

At 505, the host device may write, to a memory device, data from a host device via an interface. The operations of 505 may be performed according to the methods described with reference to FIG. 3. In some examples, aspects of the operations of 505 may be performed by a data writing component as described with reference to FIG. 4.

At 510, the host device may transmit, to the memory device after writing the data, a read command from the host device for the data. The operations of 510 may be performed according to the methods described with reference to FIG. 3. In some examples, aspects of the operations of 510 may be performed by a data reading component as described with reference to FIG. 4.

At 515, the host device may receive, at the host device via the interface in response to the read command, the data after a first error correction procedure performed by the memory device on the data, the first error correction procedure to correct up to a first quantity of errors associated with the data being stored at the memory device, the first quantity greater than or equal to one. The operations of 515 may be performed according to the methods described with reference to FIG. 3. In some examples, aspects of the operations of 515 may be performed by a data reception component as described with reference to FIG. 4.

At 520, the host device may perform, at the host device, a second error correction procedure on the data, the second error correction procedure to correct up to a second quantity of errors associated with the data being received via the interface, the second quantity greater than or equal to one. The operations of 520 may be performed according to the methods described with reference to FIG. 3. In some examples, aspects of the operations of 520 may be performed by an error correction component as described with reference to FIG. 4.

At 525, the host device may perform, at the host device after the second error correction procedure, an error detection procedure to detect up to a third quantity of errors in the data, the third quantity greater than or equal to three. The operations of 525 may be performed according to the methods described with reference to FIG. 3. In some examples, aspects of the operations of 525 may be performed by an error detection component as described with reference to FIG. 4.

In some examples, an apparatus as described herein may perform a method or methods, such as the method 500. The apparatus may include features, means, or instructions (e.g., a non-transitory computer-readable medium storing instructions executable by a processor) for writing, to a memory device, data from a host device via an interface, transmitting, to the memory device after writing the data, a read command from the host device for the data, receiving, at the host device via the interface in response to the read command, the data after a first error correction procedure performed by the memory device on the data, the first error correction procedure to correct up to a first quantity of errors associated with the data being stored at the memory device, the first quantity greater than or equal to one, performing, at the host device, a second error correction procedure on the data, the second error correction procedure to correct up to a second quantity of errors associated with the data being received via the interface, the second quantity greater than or equal to one, and performing, at the host device after the second error correction procedure, an error detection procedure to detect up to a third quantity of errors in the data, the third quantity greater than or equal to three.

Some examples of the method 500 and the apparatus described herein may further include operations, features, means, or instructions for generating, at the host device, first parity bits based on the data written to the memory device, transmitting the data to the memory device via the interface, where writing the data to the memory device may be based on transmitting the data to the memory device via the interface, and transmitting the first parity bits from the host device to the memory device, where the first parity bits may be configured to support a third error correction procedure performed by the memory device on the data, the third error correction procedure configured to correct up to a fourth quantity of errors associated with the data being transmitted to the memory device, the fourth quantity greater than or equal to one.

In some examples of the method 500 and the apparatus described herein, the error detection procedure may be configured to detect one or more errors associated with the data being written via the interface, being stored at the memory device, or being received via the interface, or any combination thereof, and the error detection procedure may be configured to detect an aliasing error associated with the first error correction procedure, the second error correction procedure, or the third error correction procedure.

Some examples of the method 500 and the apparatus described herein may further include operations, features, means, or instructions for receiving, from the memory device via the interface, first parity bits based on the data received via the interface, generating, at the host device, second parity bits based on the data received via the interface, and comparing, at the host device, the first parity bits and the second parity bits, where performing the second error correction procedure on the data at the host device may be based on comparing the first parity bits and the second parity bits.

Some examples of the method 500 and the apparatus described herein may further include operations, features, means, or instructions for generating, at the host device, first parity bits based on a portion of the data written to the memory device, where the data written to the memory device includes the portion and the first parity bits, generating, at the host device, second parity bits based on a portion of the data received via the interface, and comparing, at the host device, the first parity bits and the second parity bits, where performing the error detection procedure may be based on comparing the first parity bits and the second parity bits.

In some examples of the method 500 and the apparatus described herein, the error detection procedure may be associated with a first code, and the second error correction procedure may be associated with a second code that may have a same Hamming distance as the first code. In some examples of the method 500 and the apparatus described herein, the first code and the second code may be a same Hamming code.

It should be noted that the methods described herein describe possible implementations, and that the operations and the steps may be rearranged or otherwise modified and that other implementations are possible. Further, portions from two or more of the methods may be combined.

A system is described. The system may include a host device coupled with a memory device via an interface. The host device and the memory device may be configured to communicate data via the interface. The memory device may be configured to perform a first error correction procedure on the data, the first error correction procedure to correct up to a first quantity of errors associated with the data being stored at the memory device, the first quantity greater than or equal to one. The host device and the memory device may be configured to perform a second error correction procedure on the data communicated via the interface, the second error correction procedure to correct a second quantity of errors associated with the data being communicated via the interface, the second quantity greater than or equal to one. The host device may be configured to perform an error detection procedure on the data received via the interface, the error detection procedure to detect up to a third quantity of errors in the data, the third quantity greater than or equal to three.

In some examples, the second error correction procedure may be for data received by the host device from the memory device via the interface, and the host device and the memory device may be further configured to perform a third error correction procedure on data written from the host device to the memory device via the interface.

In some examples, the error detection procedure may be associated with a first code, and the second error correction procedure may be associated with a second code having a same Hamming distance as the first code.

In some examples, the error detection procedure may be performed by a microprocessor, a CPU, an interface controller, or any combination thereof included in the host device.

In some examples, the error detection procedure may be configured to detect one or more errors associated with the data being communicated via the interface, or being stored at the memory device, or a combination thereof.

In some examples, the error detection procedure may be configured to detect an aliasing error associated with the first error correction procedure or the second error correction procedure.

An apparatus is described. The apparatus may include an interface couplable with a memory device. The apparatus may be configured to receive data from the memory device via the interface. The apparatus may be configured to perform an error correction procedure on the data received from the memory device via the interface, the error correction procedure to correct up to a first quantity of errors associated with the data being received via the interface, the first quantity greater than or equal to one. The apparatus may further include a component coupled with the interface and configured to perform an error detection procedure on the data received via the interface, the error detection procedure to detect up to a second quantity of errors in the data, the second quantity greater than or equal to three.

In some examples, the component may be a microprocessor or a CPU of the apparatus, and the component may be coupled with an interface controller of the apparatus via a second interface (e.g., internal to the apparatus). In some examples, the interface controller and the component may be configured to perform a second error correction procedure to correct up to a third quantity of errors associated with the data being communicated via the second interface, the third quantity greater than or equal to one.

In some examples, the component may be an interface controller of the apparatus.

In some examples, the error detection procedure may be associated with a first code, and the error correction procedure may be associated with a second code having a same Hamming distance as the first code.

In some examples, the error detection procedure may be configured to detect an aliasing error associated with the error correction procedure, the second error correction procedure, or a third error correction procedure performed by the memory device on the data, and the third error correction procedure may be configured to correct up to a fourth quantity of errors associated with the data being stored at the memory device, the fourth quantity greater than or equal to one.

In some examples, the error detection procedure may be configured to detect one or more errors associated with the data being written via the interface, being stored at the memory device, or being received via the interface, or any combination thereof.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
writing, to a memory device, data from a host device via an interface;
transmitting, to the memory device after writing the data, a read command from the host device for the data;
receiving, at the host device via the interface in response to the read command, the data after a first error correction procedure performed by the memory device on the data, the first error correction procedure to correct up to a first quantity of errors associated with the data being stored at the memory device, the first quantity greater than or equal to one;
performing, at the host device, a second error correction procedure on the data using first parity bits received from the memory device and second parity bits generated by the host device, the second error correction procedure to correct up to a second quantity of errors associated with the data being received via the interface, the second quantity greater than or equal to one; and
performing, at the host device after the second error correction procedure, an error detection procedure using third parity bits generated by the host device and fourth parity bits generated by the host device to detect up to a third quantity of errors in the data, the third quantity greater than or equal to three.

2. The method of claim 1, further comprising:
receiving, from the memory device via the interface, the first parity bits based at least in part on the data received via the interface;
generating, at the host device, the second parity bits based at least in part on the data received via the interface; and
comparing, at the host device, the first parity bits and the second parity bits, wherein performing the second error correction procedure on the data at the host device is based at least in part on comparing the first parity bits and the second parity bits.

3. The method of claim 1, further comprising:
generating, at the host device, the third parity bits based at least in part on a portion of the data written to the memory device, wherein the data written to the memory device comprises the portion and the third parity bits;
generating, at the host device, the fourth parity bits based at least in part on a portion of the data received via the interface; and
comparing, at the host device, the third parity bits and the fourth parity bits, wherein performing the error detection procedure is based at least in part on comparing the third parity bits and the fourth parity bits.

4. The method of claim 1, wherein:
the error detection procedure is associated with a first code; and
the second error correction procedure is associated with a second code that has a same Hamming distance as the first code.

5. The method of claim 4, wherein the first code and the second code both comprise a same Hamming code.

6. A method, comprising:
generating, at a host device, first parity bits based at least in part on data to be written to a memory device;
transmitting the data to the memory device via an interface, wherein the data is written to the memory device based at least in part on transmitting the data to the memory device via the interface;
transmitting the first parity bits from the host device to the memory device, wherein the first parity bits are configured to support a third error correction procedure performed by the memory device on the data, the third error correction procedure configured to correct up to a fourth quantity of errors associated with the data being transmitted to the memory device, the fourth quantity greater than or equal to one;
transmitting, to the memory device after the data is written to the memory device, a read command from the host device for the data;
receiving, at the host device via the interface in response to the read command, the data after a first error correction procedure performed by the memory device on the data, the first error correction procedure to correct up to a first quantity of errors associated with the data being stored at the memory device, the first quantity greater than or equal to one;
performing, at the host device, a second error correction procedure on the data, the second error correction procedure to correct up to a second quantity of errors associated with the data being received via the interface, the second quantity greater than or equal to one; and
performing, at the host device after the second error correction procedure, an error detection procedure to detect up to a third quantity of errors in the data, the third quantity greater than or equal to three.

7. The method of claim 6, wherein the error detection procedure is configured to detect one or more errors associated with the data being written via the interface, being stored at the memory device, or being received via the interface, or any combination thereof, and wherein the error detection procedure is configured to detect an aliasing error associated with the first error correction procedure, the second error correction procedure, or the third error correction procedure.

8. A system, comprising:
a host device coupled with a memory device via an interface, wherein:
the host device and the memory device are configured to communicate data via the interface;
the memory device is configured to perform a first error correction procedure on the data, the first error correction procedure to correct up to a first quantity of errors associated with the data being stored at the memory device, the first quantity greater than or equal to one;
the host device and the memory device are configured to perform a second error correction procedure on the data communicated via the interface using first parity bits generated by the memory device and second parity bits generated by the host device, the second error correction procedure to correct a second quantity of errors associated with the data being communicated via the interface, the second quantity greater than or equal to one; and
the host device is configured to perform an error detection procedure on the data received via the interface using third parity bits generated by the host device and fourth parity bits generated by the host device, the error detection procedure to detect up to a third quantity of errors in the data, the third quantity greater than or equal to three.

9. The system of claim 8, wherein:
the second error correction procedure is for data received by the host device from the memory device via the interface; and
the host device and the memory device are further configured to perform a third error correction procedure on data written from the host device to the memory device via the interface.

10. The system of claim 8, wherein:
the error detection procedure is associated with a first code; and
the second error correction procedure is associated with a second code having a same Hamming distance as the first code.

11. The system of claim 8, wherein the error detection procedure is performed by a microprocessor, a Central Processing Unit (CPU), an interface controller, or any combination thereof included in the host device.

12. The system of claim 8, wherein the error detection procedure is configured to detect one or more errors associated with the data being communicated via the interface, or being stored at the memory device, or a combination thereof.

13. The system of claim 8, wherein the error detection procedure is configured to detect an aliasing error associated with the first error correction procedure or the second error correction procedure.

14. An apparatus configured to be a host device for a memory device, comprising:
an interface configured to communicate with the memory device, wherein:
when operating as the host device, the apparatus is configured to receive data from the memory device via the interface; and
when operating as the host device, the apparatus is configured to perform an error correction procedure on the data received from the memory device via the interface using first parity bits received from the memory device and second parity bits generated by the apparatus, the error correction procedure to correct up to a first quantity of errors associated with the data being received via the interface, the first quantity greater than or equal to one; and
an interface controller or one or more processors coupled with the interface and configured to perform an error detection procedure on the data received via the interface using third parity bits generated by the apparatus and fourth parity bits generated by the apparatus, the error detection procedure to detect up to a second quantity of errors in the data, the second quantity greater than or equal to three.

15. The apparatus of claim 14, wherein the one or more processors comprise a microprocessor or a Central Processing Unit (CPU) of the apparatus, the one or more processors coupled with the interface controller via a second interface.

16. The apparatus of claim 14, wherein the interface controller is configured to perform the error detection procedure on the data received via the interface.

17. The apparatus of claim 14, wherein:
the error detection procedure is associated with a first code; and
the error correction procedure is associated with a second code having a same Hamming distance as the first code.

18. The apparatus of claim 14, wherein the error detection procedure is configured to detect one or more errors associated with the data being written via the interface, being stored at the memory device, or being received via the interface, or any combination thereof.

19. An apparatus configured to be a host device for a memory device, comprising:
an interface configured to communicate with the memory device, wherein:
when operating as the host device, the apparatus is configured to receive data from the memory device via the interface; and
when operating as the host device, the apparatus is configured to perform an error correction procedure on the data received from the memory device via the interface using first parity bits generated by the memory device and second parity bits generated by the apparatus, the error correction procedure to correct up to a first quantity of errors associated with the data being received via the interface, the first quantity greater than or equal to one; and
a microprocessor or a Central Processing Unit (CPU) coupled with an interface controller via a second interface, wherein the microprocessor or CPU is configured to perform an error detection procedure on the data received via the interface using third parity bits generated by the apparatus and fourth parity bits generated by the apparatus, the error detection procedure to detect up to a second quantity of errors in the data, the second quantity greater than or equal to three, and wherein the interface controller and the microprocessor or CPU are configured to perform a second error correction procedure to correct up to a third quantity of errors associated with the data being communicated via the second interface, the third quantity greater than or equal to one.

20. An apparatus configured to be a host device for a memory device, comprising:
an interface configured to communicate with the memory device, wherein:
when operating as the host device, the apparatus is configured to receive data from the memory device via the interface; and
when operating as the host device, the apparatus is configured to perform an error correction procedure on the data received from the memory device via the interface, the error correction procedure to correct up to a first quantity of errors associated with the data being received via the interface, the first quantity greater than or equal to one; and
an interface controller or one or more processors coupled with the interface and configured to perform an error detection procedure on the data received via the interface, the error detection procedure to detect up to a second quantity of errors in the data, the second quantity greater than or equal to three, wherein the error detection procedure is configured to detect an aliasing error associated with the error correction procedure, a second error correction procedure, or a third error correction procedure performed by the memory device on the data, and wherein the third error correction procedure is configured to correct up to a fourth quantity of errors associated with the data being stored at the memory device, the fourth quantity greater than or equal to one.

* * * * *